US008988114B2

(12) United States Patent
Wadhwa et al.

(10) Patent No.: US 8,988,114 B2
(45) Date of Patent: Mar. 24, 2015

(54) LOW-POWER VOLTAGE TAMPER DETECTION

(71) Applicants: Sanjay K. Wadhwa, Noida (IN); Alfredo Olmos, Austin, TX (US); Fabio Duarte De Martin, Campinas (BR)

(72) Inventors: Sanjay K. Wadhwa, Noida (IN); Alfredo Olmos, Austin, TX (US); Fabio Duarte De Martin, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 232 days.

(21) Appl. No.: 13/681,956

(22) Filed: Nov. 20, 2012

(65) Prior Publication Data

US 2014/0139201 A1     May 22, 2014

(51) Int. Cl.
*H03K 5/153*     (2006.01)
*G05F 3/02*     (2006.01)

(52) U.S. Cl.
CPC .......................................... *G05F 3/02* (2013.01)
USPC ............. 327/72; 330/207; 330/307; 330/308; 327/73

(58) Field of Classification Search
USPC ........... 327/52, 53, 58, 60, 62, 63, 65–69, 71, 327/72, 74, 77–81, 88, 89, 96, 127, 246, 327/266, 274, 280, 287, 306–333, 359, 327/560–563; 361/56, 90, 91.1–91.8
See application file for complete search history.

(56) References Cited

U.S. PATENT DOCUMENTS

| | | | |
|---|---|---|---|
| 4,013,902 A | 3/1977 | Payne | |
| 4,301,380 A | 11/1981 | Thomas | |
| 4,766,567 A | 8/1988 | Kato | |
| 5,187,389 A | 2/1993 | Hall | |
| 5,196,833 A | 3/1993 | Kemp | |
| 5,199,032 A | 3/1993 | Sparks | |
| 5,396,118 A * | 3/1995 | Yaguchi | 327/516 |
| 5,440,263 A | 8/1995 | Fournel | |
| 5,457,748 A | 10/1995 | Bergum | |
| 5,495,453 A | 2/1996 | Wociechowski | |
| 5,619,156 A | 4/1997 | Jandu | |
| 5,619,165 A | 4/1997 | Fournel | |
| 5,814,995 A | 9/1998 | Tasdighi | |
| 5,903,767 A | 5/1999 | Little | |
| 5,920,182 A | 7/1999 | Migliavacca | |
| 6,002,290 A * | 12/1999 | Avery et al. | 327/333 |
| 6,559,629 B1 | 5/2003 | Fernald | |
| 6,559,692 B2 * | 5/2003 | Kimball et al. | 327/109 |
| 6,646,508 B1 * | 11/2003 | Barbetta | 330/264 |
| 6,661,218 B2 | 12/2003 | Kim | |

(Continued)

*Primary Examiner* — Brandon S Cole
(74) *Attorney, Agent, or Firm* — Luiz Von Paumgartten; Fogarty, L.L.C.

(57) ABSTRACT

Systems and methods for low-power voltage tamper detection are described. In some embodiments, an integrated circuit may include source-follower circuitry configured to produce a scaled down supply voltage. The integrated circuit may also include undervoltage detection circuitry coupled to the source-follower circuitry, the undervoltage detection circuitry configured to output a first signal having a first logic value if the scaled down supply voltage is greater than a low threshold voltage or a second logic value if the scaled down supply voltage is smaller than the low threshold voltage. Additionally or alternatively, the integrated circuit may include overvoltage detection circuitry coupled to the source-follower circuitry, the overvoltage detection circuitry configured to output a second signal having the first logic value if the scaled down supply voltage is smaller than a high threshold voltage or the second logic value if the scaled down supply voltage is greater than the high threshold voltage.

18 Claims, 4 Drawing Sheets

(56) References Cited

U.S. PATENT DOCUMENTS

| | | |
|---|---|---|
| 7,274,226 B2 | 9/2007 | Yoshizawa |
| 7,839,189 B2 | 11/2010 | Maltione |
| 2007/0103234 A1* | 5/2007 | Maejima et al. ......... 330/207 A |
| 2008/0122539 A1* | 5/2008 | Ide ............................... 330/254 |
| 2009/0115514 A1* | 5/2009 | Maejima et al. .............. 330/251 |
| 2012/0139633 A1* | 6/2012 | Nasu et al. .................... 330/254 |
| 2013/0027007 A1* | 1/2013 | Zhong et al. ................. 323/265 |

* cited by examiner

LOW-POWER VOLTAGE TAMPER DETECTION

FIELD

This disclosure relates generally to electronic circuits, and more specifically, to electronic devices having a low-power voltage tamper detector.

BACKGROUND

Electronic devices sometimes employ voltage detector circuits capable of identifying whether a particular voltage is outside a specified range. For example, battery operated devices may include a voltage detector configured to provide a low voltage indication when the voltage supplied by the battery decreases below a predetermined level. The low voltage indication may be used, for example, to notify a user that the battery should be replaced or recharged. Conversely, electronic devices that incorporate expensive or critical circuitry may sustain costly damage if their power supply voltages exceed expected values. In those cases, a device may employ voltage detection circuitry configured to identify an overvoltage condition and to take corrective and/or protective action(s).

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for a low-power voltage tamper detector. In many implementations, some of these systems and methods may be incorporated into a wide range of devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, or any other device or system having one or more electronic parts or components.

Generally speaking, such electronic devices may include one or more integrated circuits (or "chips"), and each integrated circuit may be provided one or more power supply voltage(s) in order to enable the circuit's operations.

Figure 1:
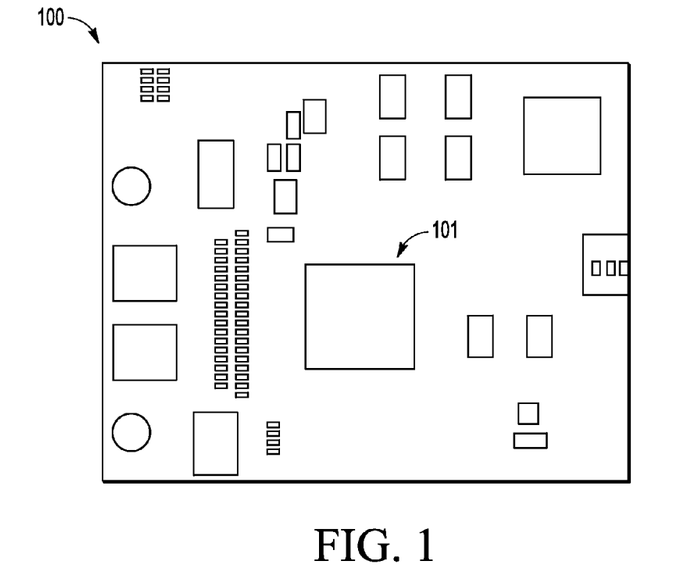
FIG. 1 is a diagram of a Printed Circuit Board (PCB) of an electronic device having one or more integrated circuits according to some embodiments.

Turning now to FIG. 1, a block diagram of an example of a Printed Circuit Board (PCB) within an electronic device is depicted. As illustrated, PCB 100 may include one or more electronic component package(s) 101 enclosing one or more integrated circuit(s). Examples of suitable integrated circuit(s) may include, for instance, System-On-Chips (SoCs), Application Specific Integrated Circuits (ASICs), Digital Signal Processors (DSPs), Field-Programmable Gate Arrays (FPGAs), processors, microprocessors, controllers, microcontrollers (MCUs), and/or the like. Moreover, integrated circuit(s) may include any tangible memory apparatus including, but not limited to, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc. As such, integrated circuit(s) may include a number of different portions, areas, or regions (e.g., processing cores, cache memories, internal bus(es), timing units, controllers, etc.).

In some cases, such integrated circuit(s) may be disposed within electronic component package 101 configured to be mounted onto PCB 100 using any suitable packaging technology (e.g., Ball Grid Array (BGA) packaging). Also, in different implementations, PCB 100 may include a plurality of other elements or components in addition to component package 101.

Integrated circuit(s) are generally designed to work properly so long as its power supply voltage(s) is kept within a specified range of values. If the integrated circuit(s) are subject to conditions outside of its voltage specifications, however, it may make it easier for an intruder, attacker, hacker, etc. to perform an unauthorized use of the circuit's operations and/or information contents (e.g., customer data, etc.). Accordingly, in some cases, an attacker may attempt to purposefully drive the integrated circuit(s) above and/or below the specified ranges of the power supply.

At least in part to help prevent unauthorized activities, certain systems and methods described herein may detect and prevent illegal use of an integrated circuit(s) out of a specified voltage range. In various embodiments, once a lower or higher than expected operation voltage condition is detected, a corresponding flag may be set to alert the integrated circuit(s) (or a user) about the potential threat. In some cases, the integrated circuit(s) may then take an action to enhance the overall system security.

Accordingly, in some implementations, a low-power voltage tamper detection circuit may operate in low-power mode (e.g., ~1 uA) and/or in an extended voltage range. Particularly, systems and methods described herein may combine a low-power bandgap circuit with a low-power, reduced area source-follower circuit to generate a scaled down power supply tap voltage that is applied to a high-resistivity P+ poly resistor (thus reducing the circuit area for a specified power consumption target) and then compared against one or more reference voltages. Additionally or alternatively, both low and high "trip points" may be provided. Additionally or alternatively, sub-1V voltage reference(s) may be provided in order to promote proper system operation.

For example, in some embodiments, a source-follower circuit may subtract a bandgap reference voltage (e.g., $V_{bg} \approx 1.2V$) from a power supply voltage (e.g., $V_{dda}$), and apply that difference in voltage to a high resistivity P+ polycrystalline silicon resistor (e.g., $R_1$) to result in an electrical current that is equal to $(V_{dda}-V_{bg})/R_1$. Such an electrical current may flow into another high resistivity P+ polycrystalline silicon resistor (e.g., $R_2$) to generate a "shifted" and "scaled down" tap voltage (e.g., $V_{dda\_SHIFTED}$) proportional to the power supply voltage (e.g., $V_{dda\_SHIFTED}=[V_{dd}-V_{bg}]R_2R_1$). As such, these various embodiments may allow reduction of resistor area for a given low-power consumption target. In this example, resistor $R_1$ may have to support only $(V_{dda}-V_{bg})$ instead of $V_{dda}$ while resistor $R_2$ may have to support $V_{dda\_SHIFTED}$.

Figure 2:
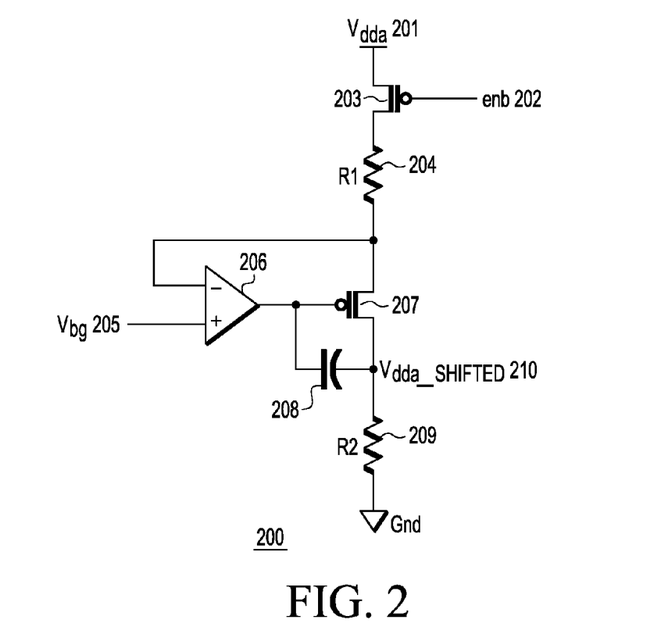
FIG. 2 is a diagram of an example of source-follower circuitry according to some embodiments.

FIG. 2 is a diagram of an example of source-follower circuitry. In some embodiments, source-follower circuitry 200 may be employed as part of a low-power voltage tamper detection circuit within integrated circuit(s) discussed in connection with FIG. 1. As illustrated, supply voltage ($V_{dda}$) 201 may be provided upon activation of "enable bar" (enb) 202, which in turn may be applied to the gate of P-type metal-oxide-semiconductor (PMOS) transistor 203 (e.g., PMOS transistor 203 turns on when enb=0 and turns off when enb=1, or vice-versa). The drain of transistor 203 is coupled to resistor ($R_1$) 204 (e.g., a high-resistivity P+ polycrystalline silicon or "poly" resistor, or the like), which is then coupled to the inverting input of low-power operational amplifier (op-amp) 206 and to the source of PMOS transistor 207.

The non-inverting input of op-amp 206 is configured to receive bandgap voltage ($V_{bg}$) 205, and the output of op-amp 206 is configured to drive the gate of PMOS transistor 207. The drain of PMOS transistor 207 is connected to resistor $R_2$ 209 to generate the scaled down power supply voltage $V_{dda\_SHIFTED}$ 210, since resistor $R_2$ 209 is tied to the negative power supply (e.g., ground or "Gnd" in FIG. 2). Capacitor 208 is operably coupled to the output of op-amp 206 and to the drain of PMOS transistor 207. In some implementations, capacitor 208 may be used to add stability to the circuit loop around op-amp 206; although stability concerns may also be addressed in other suitable ways.

In some implementations, $V_{bg}$ 205 may be a temperature independent voltage reference with a value of approximately 1.25 V, a value between 1.2V and 1.3V, or another value suitably close to the theoretical 1.22 eV bandgap of silicon at 0 K (i.e., the energy required to promote an electron from its valence band to its conduction band to become a mobile charge). For example, in some cases, a bandgap reference circuit may provide $V_{bg}$ 205. Such a bandgap reference circuit may include, for instance, a cascade of Self-Cascode MOS Field-Effect Transistor (SCM) structures and a bipolar transistor operating in an open loop configuration.

In operation, source-follower circuitry 200 may be configured to subtract $V_{bg}$ 205 from $V_{dda}$ 201 to produce $V_{dda\_SHIFTED}$ 210 across $R_2$ 209. As previously noted, the value of $V_{dda\_SHIFTED}$ in this particular example may be given by: $V_{dda\_SHIFTED}=[V_{dd}-V_{bg}]R_2/R_1$. To further illustrate this, assume an example scenario where the resistance of $R_1$ 204 is 10 MOhm, and the resistance of $R_2$ 209 is 2 MOhm. Here, when $V_{dda}$ 201 is 3.3V, $V_{dda\_SHIFTED}$ 210 is 430 mV. Also, if $V_{dda}$ 201 is raised to 3.7 V (e.g., by an attacker attempting to break into the device), then $V_{dda\_SHIFTED}$ 210 goes up to 500 mV. Conversely, if $V_{dda}$ 201 is reduced to 1.7 V, $V_{dda\_SHIFTED}$ 210 goes down to 100 mV. In other words, as $V_{dda}$ 201 varies between 1.7 and 3.7 V, $V_{dda\_SHIFTED}$ 210 varies between 100 and 500 mV, respectively. As such, $V_{dda\_SHIFTED}$ 210 is a scaled down voltage with respect to supply voltage $V_{dda}$ 201.

As previously noted, $V_{dda\_SHIFTED}$ 210 may be used by a voltage tamper detection circuit to determine whether $V_{dda}$ 201 has stepped outside of one or more voltage threshold values. For instance, $V_{dda\_SHIFTED}$ 210 may be compared with threshold reference voltages value(s) (e.g., 500 mV and 100 mV) to detect when $V_{dda}$ 201 is above 3.7 V or below 1.7 V, respectively.

It should be noted that the foregoing examples are provided for sake of illustration only. In any given implementation, suitable values for $R_1$ 204 and $R_2$ 209 may be selected to produce a desired $V_{dda\_SHIFTED}$ 210 given a particular $V_{dda}$ 201 value. Furthermore, one or more suitable voltage threshold value(s) may be selected to achieve a desired tampering sensitivity while avoiding false alarms (i.e., an inadvertent detection of tampering in the presence of normal $V_{dda}$ 201 fluctuations).

Figure 3:
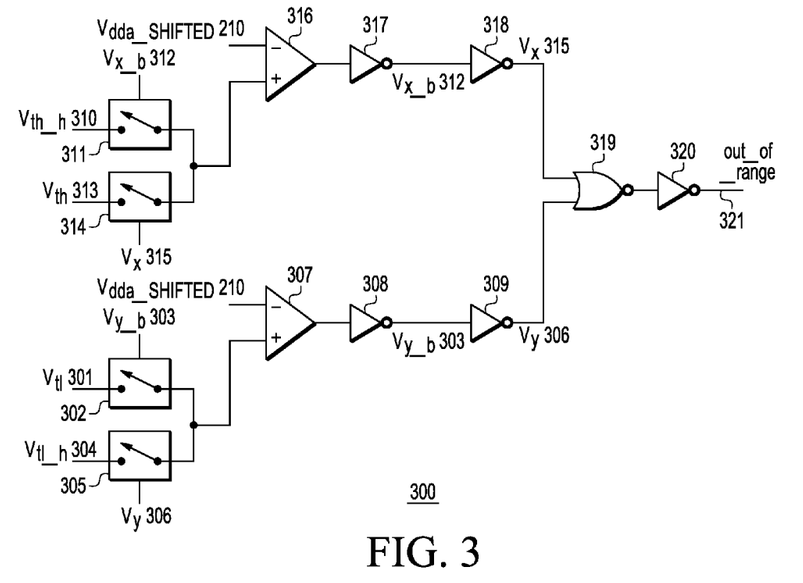
FIG. 3 is a diagram of an example of voltage tamper detection circuitry according to some embodiments.

FIG. 3 is a diagram of an example of voltage tamper detection circuitry. In some embodiments, voltage tamper detection circuitry 300 may be employed as part of a low-power voltage tamper detection circuit within integrated circuit(s) discussed in connection with FIG. 1. As shown, an undervoltage detection portion of circuitry 300 includes low-power comparator 307 configured to receive $V_{dda\_SHIFTED}$ 210 (e.g., from source-follower circuitry 200 of FIG. 2) at its inverted input and one of two low voltage threshold values at its non-inverted input. Particularly, low-power comparator 307 may receive a first low voltage threshold signal ($V_{ti}$) 301 or a second low voltage threshold signal with hysteresis ($V_{ti\_h}$) 304 through switches 305 and 302 under control of signals $V_y$ 306 and $V_{y\_b}$ 303, respectively. The output of low-power comparator 307 is passed on to inverter 308, which provides $V_{y\_b}$ 303 to inverter 309. Inverter 309 then outputs $V_y$ 306, which may be used as one of the inputs of NOR gate 319.

Meanwhile, an overvoltage detection portion of circuitry 300 includes low-power comparator 316 configured to receive $V_{dda\_SHIFTED}$ 210 (e.g., from source-follower circuitry 200 of FIG. 2) at its inverted input and one of two high voltage threshold values at its non-inverted input. Particularly, low-power comparator 316 may receive a first high voltage threshold signal ($V_{th}$) 313 or a second high voltage threshold signal with hysteresis ($V_{th\_h}$) 310 through switches 314 and 311 under control of signals $V_x$ 315 and $V_{x\_b}$ 312, respectively. The output of low-power comparator 316 is passed on to inverter 317, which provides $V_{xh}$ 312 to inverter 318. Inverter 318 outputs $V_x$ 315, which may be used as one of the inputs of NOR gate 319.

Again, the over and undervoltage detection portions of circuitry 300 may each provide its output (i.e., $V_x$ 315 and/or $V_y$ 306, respectively) to NOR gate 319. If either of $V_x$ 315 or $V_y$ 306 indicates an over or undervoltage condition, respectively, the output of NOR gate 319 becomes a logic "0," which is provided to inverter 320, and which in turn outputs an "out-of-range" signal 321 with a logic "1." However, if $V_x$ 315 does not indicate an overvoltage condition and $V_y$ 306 does not indicate an undervoltage condition, respectively, the output of NOR gate 319 becomes a logic "1," which is provided to inverter 320, and which in turn outputs an "out-of-range" signal 321 with a logic "0." In other words, in the example described, "out-of-range" signal 321 may have a logic "1" when indicating an under or over-voltage condition, or a logic "0" when $V_{dda}$ 201 is within a normal or expected voltage range.

In some embodiments, $V_{th}$ 313, $V_{th\_h}$ 310, $V_{ti}$ 301, and/or $V_{ti\_h}$ 304 may be reference voltage(s) under 1 Volt. In some cases, for example, the same low-power bandgap circuit that provides a temperature independent $V_{bg}$ 205 of FIG. 2 may also provide reference voltages $V_{th}$ 313, $V_{th\_h}$ 310, $V_{ti}$ 301, and/or $V_{ti\_h}$ 304 using a voltage divider (e.g., using a resistor ladder and ladder taps) or the like. In other cases, however, these sub-1V voltage references may be obtained from an external, low-power sub-1V voltage reference generator unrelated to the bandgap voltage. In addition, a current reference in the range of a few nA may be used to provide bias currents for various circuit elements (e.g., op-amp 206 and low-power comparators 307 and 316).

Although voltage tamper detection circuitry 300 is shown with both undervoltage and overvoltage circuit portions, it should be noted that, in some implementations, only the undervoltage circuit portion or only the overvoltage circuit portion may be used. In those situations, either $V_x$ 315 or $V_y$ 306 may be used as "out-of-range" signal 321, and logic gates 319 and/or 320 may be absent. It should also be noted that the logic levels selected to indicate an unusual voltage condition are arbitrary. For example, in some cases inverter 320 may be absent, and "out-of-range" signal 321 may indicate normal voltage conditions when its logic value is "1," and under or overvoltage when its logic value is "0."

Figure 5:
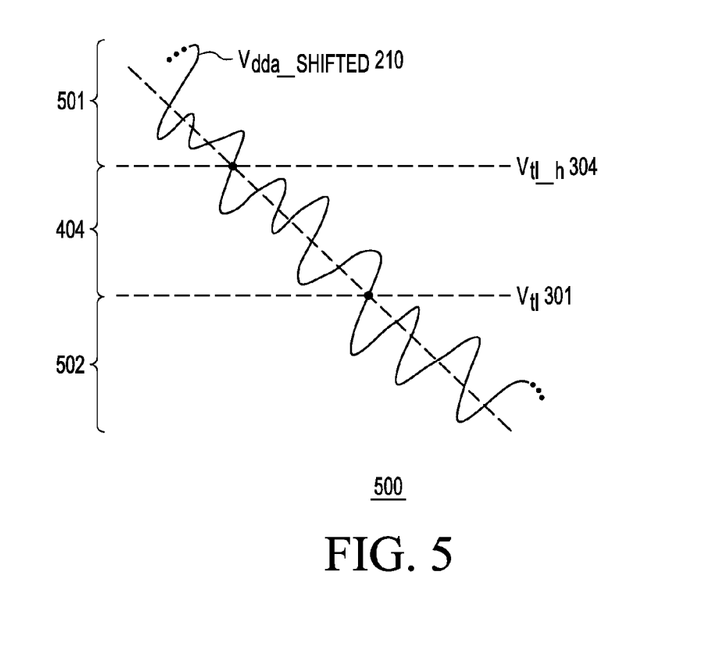
FIG. 5 is a graph illustrating possible uses of two low threshold voltage values according to some embodiments.
Figure 6:
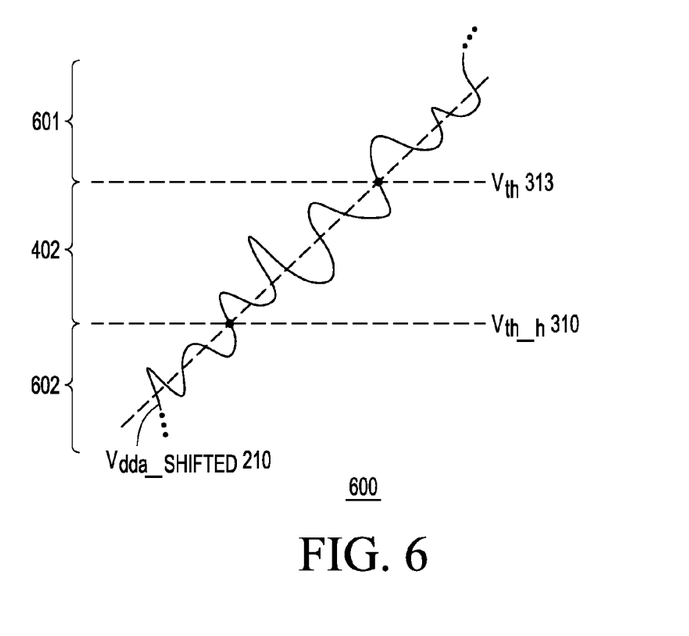
FIG. 6 is a graph illustrating possible uses of two high threshold voltage values according to some embodiments.

In the foregoing example, two low threshold voltage levels ($V_{ti}$ 301 and $V_{ti\_h}$ 304) and two high threshold voltage levels ($V_{th}$ 313 and $V_{th\_h}$ 310) are shown. Generally speaking, these two voltages may be used to provide noise immunity at system level to avoid toggling or oscillation at the "out-of-range" out signal 321 when $V_{dda\_SHIFTED}$ 210 crosses the low or the high voltage thresholds, as illustrated in FIG. 5 and FIG. 6, respectively. Although the noise onto $V_{dda}$ 201 is typically attenuated by capacitances at board and at integrated circuit levels, some noise appears onto $V_{dda\_SHIFTED}$ 210 as a small random signal on top of the linear variation of $V_{dda\_SHIFTED}$ 210. For proper circuit operation $V_{ti\_h}$ 304 may be set higher than $V_{ti}$ 301, and $V_{th\_h}$ 310 may be set lower than $V_{th}$ 313, respectively.

Figure 4:
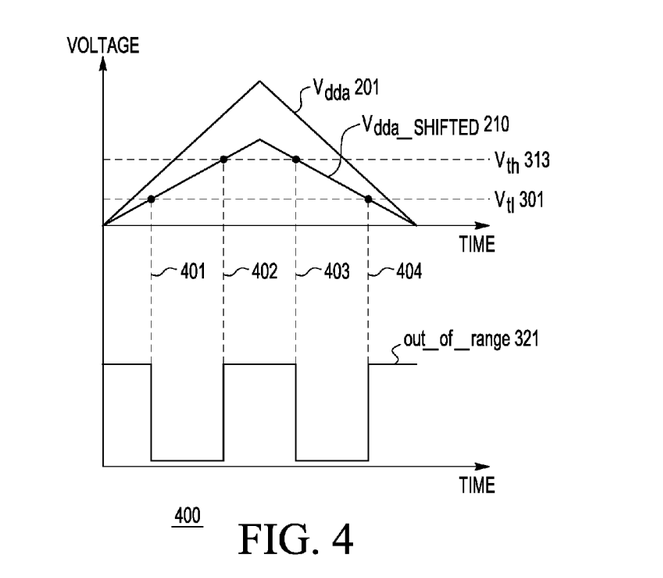
FIG. 4 is a graph illustrating examples of high and low threshold voltages, as well as an out of range signal, against a supply voltage and a "shifted" and "scaled down" supply voltage according to some embodiments.

To better illustrate operation of voltage tamper detection circuitry 300, FIG. 4 shows a graph illustrating examples of high and low threshold voltages, as well as "out-of-range" signal 321, against supply voltage $V_{dda}$ 201 and its scaled down version $V_{dda\_SHIFTED}$ 210. For purposes of graph 400, however, assume that only a first low threshold voltage ($V_{ti}$ 301) and only a first high threshold voltage ($V_{th}$ 313) are being used—again, the effects of second low threshold voltage ($V_{ti\_h}$ 304) and second high threshold voltage ($V_{th\_h}$ 310) are discussed in connection with FIGS. 5 and 6 below.

The top portion of graph 400 shows $V_{dda}$ 201 being linearly increased from 0 V to an arbitrarily high voltage value, then back to 0 V. Accordingly, $V_{dda\_SHIFTED}$ 210 also varies linearly between 0 V and a scaled down value of the same arbitrarily high voltage. In the example discussed above, when $V_{dda}$ 201 was 3.3V, $V_{dda\_SHIFTED}$ 210 was 430 mV. When $V_{dda}$ 201 was 3.7 V, $V_{dda\_SHIFTED}$ 210 was 500 mV. Also, when $V_{dda}$ 201 is reduced to 1.7 V, $V_{dda\_SHIFTED}$ 210 is 100 mV. Accordingly, in order to define "trip points" for $V_{dda}$ 201 at 3.7 V and 1.7 V using values proportional to $V_{dda\_SHIFTED}$ 210, $V_{ti}$ 301 may be set to 100 mV and $V_{th}$ 313 may be set to 500 mV (as opposed to setting $V_{ti}$ 301 to 1.7 V and $V_{th}$ 313 to 3.7 V).

When $V_{dda\_SHIFTED}$ 210 is operating between $V_{ti}$ 301 and $V_{th}$ 313 (i.e., $V_{dda}$ 201 is lower than 3.7 V and higher than 1.7 V), no undervoltage or overvoltage condition occurs. Trip points 401-404 indicate when $V_{dda\_SHIFTED}$ 210, and by implication $V_{dda}$ 201, are operating out of range. For example, at times prior to trip point 401 and after trip point 404, $V_{dda\_SHIFTED}$ 210 is 100 mV or less (i.e., $V_{dda}$ 201 is 1.7 V or less), and out-of-range signal 321, shown in the bottom part of graph 400, is at a logic "1;" here indicating an undervoltage condition. Between trip points 401 and 402 and also between trip points 403 and 404, $V_{dda\_SHIFTED}$ 210 is greater than 100 mV but smaller than 500 mV (i.e., $V_{dda}$ 201 is between 1.7 V and 3.7 V), and out-of-range signal 321 is at a logic "0," thus indicating normal operation. Between trip points 402 and 403, $V_{dda\_SHIFTED}$ 210 is equal to or greater than 500 mV (i.e., $V_{dda}$ 201 is 3.7 V or greater), and out-of-range signal 321 is at a logic "1;" here indicating an overvoltage condition.

In some embodiments, an integrated circuit employing voltage tamper detection circuitry 300 may be configured to take predetermined actions in response to out-of-range signal 321 indicating voltage tampering or the like. For example, the integrated circuit may block a memory area, erase the memory area, disallow a number of processing operations, block communications with other components (e.g., over a communications bus or the like), etc. In some cases, the predetermined action may be different depending upon the tampering is detected as an undervoltage or overvoltage condition. For instance, if the integrated circuit is known to be more easily attacked when supplied with an overvoltage, the predetermined action in that situation may be more severe than another predetermined action implemented as part of an undervoltage detection (or vice-versa).

Furthermore, in some cases, two or more undervoltage detection circuits, each with a different low threshold voltage value may be used. As such, different levels of undervoltage detection may be associated with different predetermined actions (e.g., when $V_{dda}$ 201 drops below a certain voltage level, a moderate preventive measure is implemented, and when $V_{dda}$ 201 drops further below an even lower voltage level, a more aggressive measure may be implemented). Conversely, in some cases, two or more overvoltage detection circuits, each with a different high threshold voltage value may be used. Thus, different levels of overvoltage detection may be associated with different predetermined actions (e.g., when $V_{dda}$ 201 rises above a certain voltage level, a moderate preventive measure is implemented, and when $V_{dda}$ 201 increases further above an even higher voltage level, a more aggressive measure may be implemented).

In some implementations, at least in part in order to prevent low-power comparator 307's output from toggling when both inverted and non-inverted inputs are at similar voltage levels (e.g., $V_{dda\_SHIFTED}$ 210 is close to 100 mV against $V_{ti}$ 301 at 100 mV) for a relatively long period of time, thus rapidly switching between detection and non-detection of abnormally low voltage conditions, some amount of hysteresis may be added to undervoltage detection portion of circuitry 300 by including $V_{ti\_h}$ 304.

In that regard, FIG. 5 is a graph illustrating a possible operation of the two low threshold voltages ($V_{ti}$ 301 and $V_{ti\_h}$ 304) according to some embodiments. Particularly, graph 500 may be seen as a "zoomed in" portion of graph 400 of FIG. 4 in the neighborhood of trip point 404. With reference to FIGS. 3 and 5, $V_{dda\_SHIFTED}$ 210 is greater than $V_{ti\_h}$ 304 and $V_{ti}$ 301 in region 501. During this time, the output of low-power comparator 307 is a logic low ("0"), $V_{y\_b}$ 303 is a logic high ("1"), and $V_y$ 306 is a logic low. In this case, switch 302 is turned on and switch 305 is turned off—that is, the comparison being made is between $V_{dda\_SHIFTED}$ 210 and $V_{ti}$ 301. The situation remains unchanged when $V_{dda\_SHIFTED}$ 210 goes further down into region 404—that is, $V_{dda\_SHIFTED}$ 210 is lower than $V_{ti\_h}$ 304 but higher than $V_{ti}$ 301.

When $V_{dda\_SHIFTED}$ 210 reaches $V_{ti}$ 301 at the lower end of region 404, $V_{dda\_SHIFTED}$ 210 is lower than both $V_{ti\_h}$ 304 and $V_{ti}$ 301. Then, the output of low-power comparator 307 goes to a logic high, $V_{y\_b}$ 303 goes to a logic low, and $V_y$ 306 goes to a logic high. Thus, switch 302 is turned off, and switch 305 is turned on—that is, the comparison being made is now between $V_{dda\_SHIFTED}$ 210 and $V_{ti\_h}$ 304. Since $V_{dda\_SHIFTED}$ 210 is lower than both $V_{ti\_h}$ 304 and $V_{ti}$ 301, and $V_{th\_h}$ 304 is higher than $V_{th}$ 301, the circuit condition remains the same. Electrical noise coming from $V_{dda}$ 201 and coupled onto $V_{dda\_SHIFTED}$ 210 with some attenuation does not change the output of low-power comparator 307, provided that the difference between $V_{ti\_h}$ 304 and $V_{ti}$ 301 is larger than that noise. In some embodiments, such a hysteresis voltage may be set to produce a ~100 mV guard band in terms of $V_{dda}$ 201.

Then, when $V_{dda}$ 201 goes up and $V_{dda\_SHIFTED}$ 210 rises (in a scaled down factor) above $V_{ti\_h}$ 304, the output of low-power comparator 307 changes to a logic low, so circuitry 300 again indicates normal operation regarding power supply $V_{dda}$ 201. In some embodiments, assuming the hysteresis voltage with regard to $V_{dda}$ 201 is set to be 100 mV, $V_{dda}$ 201 may be at 1.8 V or above to be in normal operation.

Similarly, at least in part in order to prevent comparator 316 from toggling when both inverted and non-inverted inputs are at similar voltage levels (e.g., $V_{dda\_SHIFTED}$ 210 is close to 500 mV against $V_{th}$ 313 at 500 mV) for a relatively long period of time, overvoltage detection portion of circuitry 300 may include $V_{th\_h}$ 310.

FIG. 6 is a graph illustrating a possible operation of the two high threshold voltages ($V_{th}$ 313 and $V_{th\_h}$ 310) according to some embodiments. Particularly, graph 600 may be seen as a "zoomed in" portion of graph 400 of FIG. 4 in the neighborhood of trip point 402. With reference to FIGS. 3 and 6, $V_{dda\_SHIFTED}$ 210 is smaller than both $V_{th\_h}$ 313 and $V_{th\_h}$ 310 in region 602. During this time, the output of the low power comparator 316 is a logic high ("1"), $V_{x\_b}$ 312 is a logic low ("0"), and $V_x$ 315 is a logic high. In this case, switch 311 is turned off and switch 314 is turned on—that is, the comparison being made is between $V_{dda\_SHIFTED}$ 210 and $V_{th}$ 313. The condition remains the same when $V_{dda\_SHIFTED}$ 210 further goes up and is in region 402—that is, $V_{dda\_SHIFTED}$ 210 is higher than $V_{th\_h}$ 310 but lower than $V_{th}$ 313.

When $V_{dda\_SHIFTED}$ 210 reaches $V_{th}$ 313 at the higher end of region 402, $V_{dda\_SHIFTED}$ 210 is higher than both $V_{th\_h}$ 310 and $V_{th}$ 313. Then, the output of the low-power comparator 316 is a logic low, $V_{x\_b}$ 312 is a logic high, and $V_x$ 315 is a logic low. Thus, switch 311 is turned on and switch 314 is turned off—that is, the comparison being made is now between $V_{dda\_SHIFTED}$ 210 and $V_{th\_h}$ 310. Because $V_{dda\_SHIFTED}$ 210 is higher than both $V_{th\_h}$ 310 and $V_{th}$ 313, and $V_{th}$ 313 is higher than $V_{th\_h}$ 310, the condition remains the same. The noise coming from $V_{dda}$ 201 and coupled onto $V_{dda\_SHIFTED}$ 210 with some attenuation does not change the output of low-power comparator 316, provided that the difference between $V_{th}$ 313 and $V_{th\_h}$ 310 is larger than that noise. In some embodiment, the hysteresis voltage may be set to provide a 100 mV guard band in terms of $V_{dda}$ 201.

Then, when $V_{dda}$ 201 goes down and $V_{dda\_SHIFTED}$ 210 also decreases (in a scaled down factor) below $V_{th\_h}$ 310, the output of the low power comparator 316 changes to a logic low, and circuitry 300 again indicates normal operation regarding power supply $V_{dda}$ 201. In some embodiments, assuming the hysteresis voltage with regard to $V_{dda}$ 201 is set to be 100 mV, $V_{dda}$ 201 may be at 3.6 V or below to be in normal operation.

In some embodiments, $V_{th\_h}$ 313 and $V_{th\_h}$ 310 may be within a few millivolts, or a few tens of millivolts of each other. Similarly, $V_{ti}$ 301 and $V_{th\_h}$ 304 may also be within a few millivolts, or within a few tens of millivolts of each other.

Figure 7:
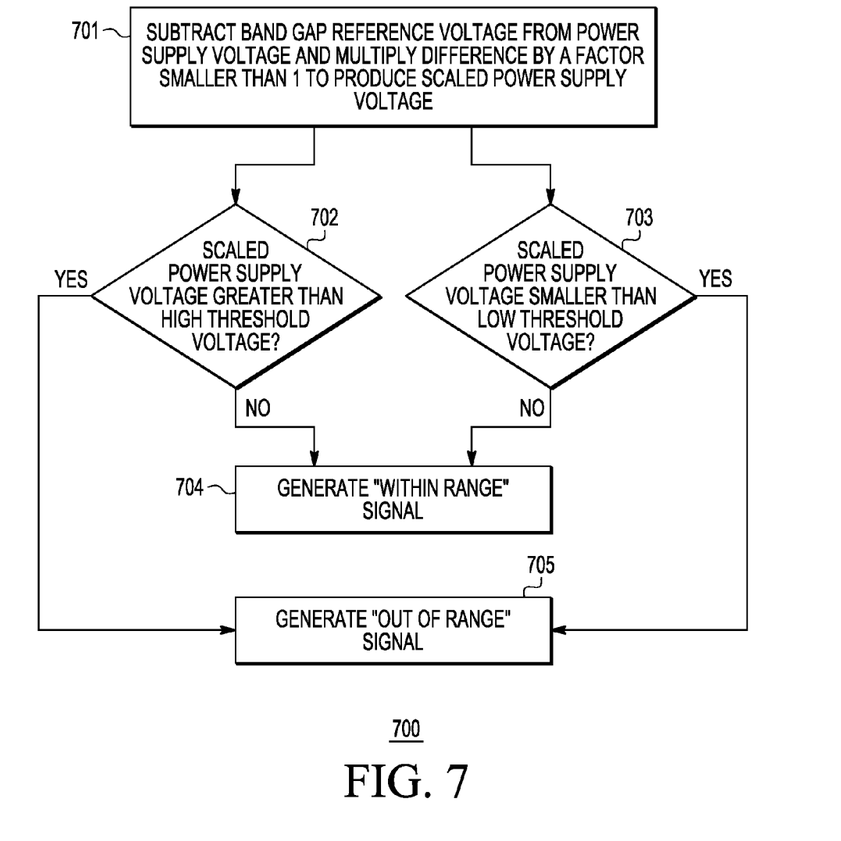
FIG. 7 is a flowchart of an example of a method of performing voltage tamper detection according to some embodiments.

FIG. 7 is a flowchart of an example of a method of performing voltage tamper detection. In some embodiments, method 700 may be performed, at least in part, by voltage tamper detection circuitry 300 of FIG. 3 in conjunction with the source-follower circuitry 200 of FIG. 2. At block 701, method 700 may include subtracting a bandgap reference voltage (e.g., $V_{bg}$ 205) from a power supply voltage (e.g., $V_{dda}$ 201) and multiplying the difference by a factor smaller than 1 to produce a scaled down power supply voltage (e.g., $V_{dda\_SHIFTED}$ 210).

At block 702, method 700 may include determining whether the scaled power supply voltage is greater than one or more high threshold voltages. If so, method 700 may include generating an "out of range" signal (e.g., "out_of_range" signal 321 is set at a logic high) at block 705. Otherwise, method 700 may include generating a "within range" signal (e.g., "out_of_range" signal 323 is set at a logic low) at block 704. Additionally or alternatively, at block 703, method 700 may include determining whether the scaled power supply voltage is smaller than one or more low threshold voltages. If so, method 700 may include generating the "out of range" signal (e.g., "out_of_range" signal 323 is set at a logic high) at block 705. Otherwise, method 700 may include generating the "within range" signal (e.g., "out_of_range" signal 323 is set at a logic low) at block 704.

It should be understood that the various operations described herein, particularly in connection with FIG. 7, may be implemented by processing circuitry or other hardware components. The order in which each operation of a given method is performed may be changed, and various elements of the systems illustrated herein may be added, reordered, combined, omitted, modified, etc. It is intended that the invention(s) described herein embrace all such modifications and changes and, accordingly, the above description should be regarded in an illustrative rather than a restrictive sense.

In some embodiments, the use of source-follower circuitry 200 may uniquely satisfy a number of design parameters such as, for example: low power consumption, temperature stability, small area, good noise immunity, and/or high precision. In some cases, two or more of these parameters may be satisfied simultaneously. In other cases, all of these requirements may be satisfied simultaneously. In addition, the use of source-follower circuitry 200 may, in some instances, reduce or eliminate the need for a power hungry bandgap or reference voltage continuously enabled, thus further promoting low power operation. Moreover, in some cases, the use of one or more high resistivity P+ poly resistors 204/209 may also reduce or minimize silicon area for a given power consumption. The use of sub-1V voltage reference(s) $V_{th}$ 313, $V_{th\_h}$ 310, $V_{ti}$ 301, and/or $V_{ti\_h}$ 304 may further reduce the overall power consumption.

In an illustrative, non-limiting embodiment, an integrated circuit may include source-follower circuitry configured to produce a scaled down supply voltage, and undervoltage detection circuitry operably coupled to the source-follower circuitry, the undervoltage detection circuitry configured to output a first signal having a first logic value in response to the scaled down supply voltage being greater than a low threshold voltage or a second logic value in response to the scaled down supply voltage being smaller than the low threshold voltage.

In some implementations, the source-follower circuitry may include two or more resistors and it may be configured to subtract a bandgap voltage from a supply voltage to produce the scaled down supply voltage. Also, in some cases, the low threshold voltage may be 1 Volt or less.

For example, the undervoltage detection circuitry may be further configured to compare the scaled down supply voltage with a first low threshold voltage value in response to the scaled down supply voltage being greater than the first low threshold voltage value. Additionally or alternatively, the undervoltage detection circuitry may be further configured to compare the scaled down supply voltage with a second low threshold voltage value in response to the scaled down supply voltage being equal to or smaller than the first low threshold voltage value, the second low threshold voltage value being greater than the first low threshold voltage value.

In some implementations, the integrated circuit may include overvoltage detection circuitry operably coupled to the source-follower circuitry, the overvoltage detection circuitry configured to output a second signal having the first logic value in response to the scaled down supply voltage being smaller than a high threshold voltage or the second logic value in response to the scaled down supply voltage being greater than the high threshold voltage. The integrated circuit may further include logic circuitry operably coupled to the undervoltage detection circuitry and to the overvoltage detection circuitry, the logic circuitry configured to output an out-of-range signal in response to at least one of the first or second signals having the second logic level.

In another illustrative, non-limiting embodiment, an integrated circuit may include source-follower circuitry configured to produce a scaled down supply voltage, and overvoltage detection circuitry operably coupled to the source-follower circuitry, the overvoltage detection circuitry configured to output a first signal having a first logic value in response to the scaled down supply voltage being smaller than a high threshold voltage or a second logic value in response to the scaled down supply voltage being greater than the high threshold voltage.

In some implementations, the source-follower circuitry may include two or more resistors and it may be configured to subtract a bandgap voltage from a supply voltage to produce the scaled down supply voltage. Also, in some cases, the high threshold voltage may be 1 Volt or less.

For example, the overvoltage detection circuitry may be configured to compare the scaled down supply voltage with a first high threshold voltage value in response to the scaled down supply voltage being smaller than the first high threshold voltage value. Additionally or alternatively, the overvoltage detection circuitry may be configured to compare the scaled down supply voltage with a second high threshold voltage value in response to the scaled down supply voltage being equal to or greater than the first high threshold voltage value, the second high threshold voltage value being smaller than the first high threshold voltage value.

In some implementations, the integrated circuit may include undervoltage detection circuitry operably coupled to the source-follower circuitry, the undervoltage detection circuitry configured to output a second signal having the first logic value in response to the scaled down supply voltage being greater than a low threshold voltage or the second logic value in response to the scaled down supply voltage being smaller than the low threshold voltage. The integrated circuit may further include logic circuitry operably coupled to the overvoltage detection circuitry and to the undervoltage detection circuitry, the logic circuitry configured to output an out-of-range signal in response to at least one of the first or second signals having the second logic level.

In yet another illustrative, non-limiting embodiment, a method may include subtracting a bandgap reference voltage from a power supply voltage to produce a scaled power supply voltage, and at least one of: (a) generating a first signal having a first logic level response to the scaled power supply voltage being greater than a low threshold voltage or having a second logic level in response to the scaled power supply voltage being smaller than the low threshold voltage or (b) generating a second signal having the first logic value in response to the scaled power supply voltage being smaller than a high threshold voltage or the second logic value in response to the scaled power supply voltage being greater than the high threshold voltage. In some cases, the method may further include producing an out-of-range signal in response to at least one of the first or second signals having the second logic level.

The method may also include making a comparison between the scaled power supply voltage and a first low threshold value or a second low threshold value based, at least in part, upon a result of a previous comparison between the scaled power supply voltage and the first low threshold value. For example, the method may include comparing the scaled power supply voltage with a first low threshold voltage value if the scaled power supply voltage is greater than the first low threshold value and comparing the scaled power supply voltage with a second low threshold value if to the scaled power supply voltage is equal to or smaller than the first low threshold value, the second low threshold value being greater than the first low threshold value.

Additionally or alternatively, the method may include making a comparison between the scaled power supply voltage and a first high threshold value or a second high threshold value based, at least in part, upon a result of a previous comparison between the scaled power supply voltage and the first high threshold value. For example, the method may include comparing the scaled power supply voltage with a first high threshold voltage value if the scaled power supply voltage is smaller than the first high threshold voltage value and comparing the scaled power supply voltage with a second high threshold voltage value if the scaled power supply voltage is equal to or greater than the first high threshold voltage value, the first high threshold voltage value being greater than the second high threshold voltage value.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An integrated circuit, comprising:
source-follower circuitry configured to produce a scaled down supply voltage; and
undervoltage detection circuitry operably coupled to the source-follower circuitry, the undervoltage detection circuitry configured to output a first signal having a first logic value in response to the scaled down supply voltage being greater than a low threshold voltage or a second logic value in response to the scaled down supply voltage being smaller than the low threshold voltage, the undervoltage detection circuitry further configured to compare the scaled down supply voltage with a first low threshold voltage value in response to the scaled down supply voltage being greater than the first low threshold voltage value.

2. The integrated circuit of claim 1, the source-follower circuitry including two or more resistors and configured to subtract a bandgap voltage from a supply voltage to produce the scaled down supply voltage.

3. The integrated circuit of claim 1, wherein the low threshold voltage is 1 Volt or less.

4. The integrated circuit of claim 1, the undervoltage detection circuitry further configured to compare the scaled down supply voltage with a second low threshold voltage value in response to the scaled down supply voltage being equal to or smaller than the first low threshold voltage value, the second low threshold voltage value being greater than the first low threshold voltage value.

5. The integrated circuit of claim 1, further comprising overvoltage detection circuitry operably coupled to the source-follower circuitry, the overvoltage detection circuitry configured to output a second signal having the first logic value in response to the scaled down supply voltage being smaller than a high threshold voltage or the second logic value in response to the scaled down supply voltage being greater than the high threshold voltage.

6. The integrated circuit of claim 5, further comprising logic circuitry operably coupled to the undervoltage detection circuitry and to the overvoltage detection circuitry, the logic circuitry configured to output an out-of-range signal in response to at least one of the first or second signals having the second logic level.

7. An integrated circuit, comprising:
source-follower circuitry configured to produce a scaled down supply voltage; and
overvoltage detection circuitry operably coupled to the source-follower circuitry, the overvoltage detection circuitry configured to output a first signal having a first logic value in response to the scaled down supply voltage being smaller than a high threshold voltage or a second logic value in response to the scaled down supply voltage being greater than the high threshold voltage, the overvoltage detection circuitry further configured to compare the scaled down supply voltage with a first high threshold voltage value in response to the scaled down supply voltage being smaller than the first high threshold voltage value.

8. The integrated circuit of claim 7, the source-follower circuitry including two or more resistors and configured to subtract a bandgap voltage from a supply voltage to produce the scaled down supply voltage.

9. The integrated circuit of claim 7, wherein the high threshold voltage is 1 Volt or less.

10. The integrated circuit of claim 7, the overvoltage detection circuitry further configured to compare the scaled down supply voltage with a second high threshold voltage value in response to the scaled down supply voltage being equal to or greater than the first high threshold voltage value, the second high threshold voltage value being smaller than the first high threshold voltage value.

11. The integrated circuit of claim 7, further comprising undervoltage detection circuitry operably coupled to the source-follower circuitry, the undervoltage detection circuitry configured to output a second signal having the first logic value in response to the scaled down supply voltage being greater than a low threshold voltage or the second logic value in response to the scaled down supply voltage being smaller than the low threshold voltage.

12. The integrated circuit of claim 11, further comprising logic circuitry operably coupled to the overvoltage detection circuitry and to the undervoltage detection circuitry, the logic circuitry configured to output an out-of-range signal in response to at least one of the first or second signals having the second logic level.

13. A method, comprising:
subtracting a bandgap reference voltage from a power supply voltage to produce a scaled power supply voltage; and
generating a first signal having a first logic level in response to the scaled power supply voltage being greater than a low threshold voltage or having a second logic level in response to the scaled power supply voltage being smaller than the low threshold voltage, wherein generating the first signal further comprises:
comparing the scaled power supply voltage with a first low threshold voltage value if the scaled power supply voltage is greater than the first low threshold value; and
comparing the scaled power supply voltage with a second low threshold value if the scaled power supply voltage is equal to or smaller than the first low threshold value, the second low threshold value being greater than the first low threshold value.

14. The method of claim 13, further comprising producing an out-of-range signal in response to at least one of the first or second signals having the second logic level.

15. The method of claim 13, further comprising making the comparison between the scaled power supply voltage and the first low threshold value or the second low threshold value based, at least in part, upon a result of a previous comparison between the scaled power supply voltage and a previous first low threshold value.

16. An integrated circuit, comprising:
source-follower circuitry configured to produce a scaled down supply voltage;
undervoltage detection circuitry operably coupled to the source-follower circuitry, the undervoltage detection circuitry configured to output a first signal having a first logic value in response to the scaled down supply voltage being greater than a low threshold voltage or a second logic value in response to the scaled down supply voltage being smaller than the low threshold voltage; and
overvoltage detection circuitry operably coupled to the source-follower circuitry, the overvoltage detection circuitry configured to output a second signal having the first logic value in response to the scaled down supply voltage being smaller than a high threshold voltage or the second logic value in response to the scaled down supply voltage being greater than the high threshold voltage.

17. A method, comprising:

subtracting a bandgap reference voltage from a power supply voltage to produce a scaled power supply voltage; and generating a second signal having the first logic value in response to the scaled power supply voltage being smaller than a high threshold voltage or the second logic value in response to the scaled power supply voltage being greater than the high threshold voltage, wherein generating the second signal further comprises:

comparing the scaled power supply voltage with a first high threshold voltage value if the scaled power supply voltage is smaller than the first high threshold voltage value; and     comparing the scaled power supply voltage with a second high threshold voltage value if the scaled power supply voltage is equal to or greater than the first high threshold voltage value, the first high threshold voltage value being greater than the second high threshold voltage value.

18. The method of claim 17, further comprising making the comparison between the scaled power supply voltage and the first high threshold value or the second high threshold value based, at least in part, upon a result of a previous comparison between the scaled power supply voltage and a previous first high threshold value.

* * * * *